United States Patent
Czettl et al.

(10) Patent No.: US 10,920,325 B2
(45) Date of Patent: Feb. 16, 2021

(54) METHOD FOR PRODUCING A HARD MATERIAL LAYER ON A SUBSTRATE, HARD MATERIAL LAYER, MACHINING TOOL AND COATING SOURCE

(71) Applicants: CERATIZIT AUSTRIA GESELLSCHAFT M.B.H., Reutte (AT); PLANSEE COMPOSITE MATERIALS GMBH, Lechbruck Am See (AT)

(72) Inventors: Christoph Czettl, Poels (AT); Markus Pohler, Reutte (AT); Peter Polcik, Reutte (AT); Martin Kathrein, Ried (AT)

(73) Assignees: Ceratizit Austria Gesellschaft m.b.H., Reutte (AT); Plansee Composite Materials GmbH, Lechbruck am See (DE)

( * ) Notice: Subject to any disclaimer, the term of this patent is extended or adjusted under 35 U.S.C. 154(b) by 189 days.

(21) Appl. No.: 16/083,058

(22) PCT Filed: Mar. 3, 2017

(86) PCT No.: PCT/AT2017/000010
§ 371 (c)(1),
(2) Date: Sep. 7, 2018

(87) PCT Pub. No.: WO2017/152196
PCT Pub. Date: Sep. 14, 2017

(65) Prior Publication Data
US 2019/0062924 A1    Feb. 28, 2019

(30) Foreign Application Priority Data
Mar. 7, 2016  (AT) .................. GM 49/2016

(51) Int. Cl.
| | | |
|---|---|---|
| B23B 27/14 | (2006.01) | |
| C23C 28/00 | (2006.01) | |
| C23C 14/06 | (2006.01) | |
| C23C 28/04 | (2006.01) | |

(52) U.S. Cl.
CPC .......... C23C 28/347 (2013.01); B23B 27/148 (2013.01); C23C 14/0635 (2013.01);
(Continued)

(58) Field of Classification Search
CPC .............. B23B 27/148; B23B 2224/24; B23B 2224/3407; C23C 14/06; C23C 14/0641; C23C 14/22; C23C 28/347; C23C 28/42
(Continued)

(56) References Cited

U.S. PATENT DOCUMENTS

| | | | | |
|---|---|---|---|---|
| 7,947,363 B2 * | 5/2011 | Xu | ........................ | C23C 28/042 428/698 |
| 8,586,175 B2 * | 11/2013 | Chang | ................. | C23C 14/0641 428/216 |

(Continued)

FOREIGN PATENT DOCUMENTS

| | | |
|---|---|---|
| CN | 102099138 A | 5/2011 |
| CN | 102978576 A | 3/2013 |

(Continued)

OTHER PUBLICATIONS

M. Cekada, et al.; "Characterization of (Cr,Ta)N hard coatings reactively sputtered at low temperature"; Vacuum, Year 1999; pp. 461-467; vol. 52; published by Elsevier.
(Continued)

*Primary Examiner* — Archene A Turner
(74) *Attorney, Agent, or Firm* — Laurence A. Greenberg; Werner H. Sterner; Ralph E. Locher

(57) ABSTRACT

A process for producing a hard material layer on a substrate. A multilayer coating system is applied to the substrate by
(Continued)

alternate deposition of CrTaN and AlTiN by way of physical vapor deposition (PVD). The CrTaN and/or the AlTiN are preferably deposited from a composite target.

22 Claims, 3 Drawing Sheets

(52) U.S. Cl.
CPC ...... *C23C 14/0641* (2013.01); *C23C 14/0688* (2013.01); *C23C 28/042* (2013.01); *C23C 28/044* (2013.01); *C23C 28/048* (2013.01); *C23C 28/341* (2013.01); *C23C 28/42* (2013.01); *B23B 2224/24* (2013.01)

(58) Field of Classification Search
USPC ............ 204/192.1, 192.15, 192.16; 428/216, 428/697, 698, 699
See application file for complete search history.

(56) References Cited

U.S. PATENT DOCUMENTS

| | | |
|---|---|---|
| 9,855,608 B2 | 1/2018 | Park et al. |
| 2001/0002855 A1 | 6/2001 | Onisawa et al. |
| 2009/0186230 A1 | 7/2009 | Sun et al. |
| 2011/0117344 A1 | 5/2011 | Chen et al. |
| 2013/0284793 A1* | 10/2013 | Moriguchi ......... B23K 20/1245 228/2.1 |
| 2014/0272391 A1 | 9/2014 | Kumar et al. |

FOREIGN PATENT DOCUMENTS

| | | |
|---|---|---|
| DE | 112014004132 T5 | 5/2016 |
| EP | 2353743 A1 | 8/2011 |
| EP | 2835445 A1 | 2/2015 |
| JP | 2013221215 A | 10/2013 |
| KR | 20040001885 A | 1/2004 |
| WO | 2015034203 A1 | 3/2015 |

OTHER PUBLICATIONS

Yung-I Chen, et al.; "Thermal stability of TaN, CrTaN, TaSiN, and CrTaSiN hard coatings in oxygen-containing atmospheres"; Surface & Coatings Technology; Year 2014; pp. 1-8; published by Elsevier.

Yung-I Chen, et al.; "Preparation and annealing study of CrTaN coatings on WC-Co"; Surface & Coatings Technology; Jun. 17, 2011; pp. 1640-1647; published by Elsevier.

* cited by examiner

METHOD FOR PRODUCING A HARD MATERIAL LAYER ON A SUBSTRATE, HARD MATERIAL LAYER, MACHINING TOOL AND COATING SOURCE

BACKGROUND OF THE INVENTION

Technical Field

The present invention relates to a process for producing a hard material layer on a substrate, wherein a multilayer coating system is deposited on the substrate by means of PVD. The process is preferably employed for producing cutting tools for turning, milling or other cutting machining methods.

The present invention further relates to a hard material layer and also a cutting tool, preferably a cutting body or an indexable cutting plate or a solid cemented carbide tool.

The present invention further relates to a process for producing a coating source and also a coating source for carrying out the process for producing a hard material layer on a substrate.

PRIOR ART

In order to increase the wear resistance of cutting tools subject to wear and other components, the application of hard material layers which further increase the wear resistance of the respective components is known.

The respective hard material coating is usually deposited by means of physical or chemical vapor deposition of layers on likewise wear-resistant substrate materials. Substrate materials used here are, for example, cemented carbides, cermets, hard materials or tool steels.

For the purposes of the present invention, cemented carbide is a composite material which usually comprises a main phase composed of tungsten carbide (WC) and optionally phases of further carbides and a metallic binder or a corresponding metallic matrix. Cobalt, nickel and/or iron are usually used as metallic matrix. As further carbides, it is possible to use carbides of metals of the fourth (titanium group), fifth (vanadium group) and sixth (chromium group) transition group, i.e., for example, of tantalum, niobium, hafnium, zirconium, etc.

For the purposes of the present invention, cermets are composite materials which, in respect of the carbides, contain titanium carbide as main phase. The main proportion of the binder is typically formed by nickel and/or cobalt.

For the purposes of the present invention, hard materials are materials having a hardness of more than 10 GPa.

Tool steels are in turn steels in accordance with DIN 17300 which are defined by their use in tools.

In the case of the coating processes, coating of the corresponding substrates for producing the cutting tools can be carried out by a chemical or physical route. Corresponding coating processes are the CVD process, also known as chemical vapor deposition, and the PVD process, also known as physical vapor deposition. Only the PVD process will be looked at in the following.

Known PVD processes are, inter alia, thermal vaporization, electron beam vaporization, magnetron sputtering, laser beam vaporization and electric arc vaporization. In all PVD processes, the material to be deposited is present in solid form in the evacuated coating chamber. The material, which is also referred to as coating source or target, is vaporized by bombardment with, for example, laser beams, magnetically deflected ions or electrons or by means of an electric arc discharge. The proportion of atoms, ions or larger clusters in the vapor differs from process to process.

The vaporized material travels either ballistically or directed by electric fields through the chamber and impinges on the parts to be coated, where layer formation occurs.

When the vaporized materials impinge on the substrate, they begin to deposit on the surface of the substrate as a result of condensation. The particles do not remain at the place where they impinge on the substrate, but move, depending on how high their energy is, along the surface (surface diffusion) in order to find an energetically more favorable position. These are places on the crystal surface having the greatest number of atomic neighbors (higher binding energy).

Virtually all metals and also carbon can be deposited in very pure form by means of the various PVD variants. If reactive gases such as oxygen, nitrogen or hydrocarbons are introduced into the process, oxides, nitrides or carbides can also be deposited.

It is known from Ĉekada et al. (Vakuum 52, 1999/461-467) that a CrTaN hard material coating having a composition of $Cr_{0.58}Ta_{0.42}N$ or $Cr_{0.17}Ta_{0.83}N$ can be applied to a substrate by means of PVD. The coatings displayed a cubic structure and good oxidation resistance. In the publication, it is concluded that neither the chromium-rich $Cr_{0.58}Ta_{0.42}N$ coating nor the tantalum-rich $Cr_{0.17}Ta_{0.83}N$ coating would have any advantages over conventional CrN or TaN binary coatings.

Chen et al. examined single-layer, crystalline $Ta_{48}N_{52}$ and $Cr_{23}Ta_{27}N_{50}$ coatings and also virtually amorphous $Ta_{22}Si_{19}N_{59}$ and $Cr_6Ta_{25}Si_{11}N_{58}$ coatings which had been applied to a silicon substrate using a cosputtering process. (Y.-L. Chen, et al. serve.code.technol.(2014) http://dx.doi.org-10.1016/jp.serve.code.2014.02.005).

Chen et al. (Surface and Coatings Technology 2006/2011/ 1640-1647) have also deposited single-layer CrTaN coatings on WC substrates using reactive magnetron sputtering without heating of the substrates. The CrTaN layers had cubic (fcc) structures with a preferential (111) orientation. According to the publication, the layer is well suited as oxidation protection for glass melting tanks or cutting tools.

BRIEF SUMMARY OF THE INVENTION

Proceeding from the known prior art, it is an object of the present invention to provide a process for producing a hard material layer on a substrate, and also a hard material layer and a cutting tool having properties which have been improved further in respect of the wear resistance and the hardness.

This object is achieved by a process having the features of claim 1. Advantageous embodiments may be derived from the dependent claims.

The invention accordingly proposes a process for producing a hard material layer on a substrate, wherein a multilayer coating system is, according to the invention, applied to the substrate by alternate deposition of CrTaN and AlTiN by means of physical vapor deposition (PVD).

Compared to the processes known from the prior art for producing hard material layers, in particular CrTaN hard material layers, the multilayer coating system built up by alternate deposition of CrTaN and AlTiN makes it possible to achieve a significant increase in hardness of the hard material layer deposited in this way. This has a positive effect on the wear properties compared to the CrTaN single layers discussed in the prior art. A significant increase in hardness can also be achieved compared to the formation of a two-layer system composed of CrTaN and AlTiN.

It is known that single-layer hard material coatings composed of pure CrTaN have a low coefficient of friction, so that they are in principle well suited for cutting and machining tools. However, it is also known that the wear resistance of a hard material layer composed of pure CrTaN is not very high.

On the other hand, a significant increase in hardness can be achieved by the proposed buildup of the multilayer coating system from CrTaN and AlTiN, so that the suitability of the hard material layer produced in this way for a cutting and machining tool is significantly improved. Furthermore, the multilayer coating system composed of CrTaN and AlTiN makes it possible to achieve a reduced coefficient of friction compared to pure AlTiN layers, so that improved properties for use in cutting and machining tools are obtained.

Furthermore, it has been found that the thermal decomposition of CrTaN into $Cr_2N$ and $Ta_2N$, as would occur in the case of a single-layer coating and as is described in the literature, is largely suppressed by deposition of the multilayer coating system. This leads to particular suitability of the hard material layers produced in the abovementioned way for high-temperature use. Accordingly, the process presented is suitable for producing a hard material layer and the hard material layer resulting therefrom is not only suitable for use as wear protection layer on tools, for example on cemented carbide indexable cutting plates or solid cemented carbide tools, but can, for example, also be employed as oxidation protection for elements of glass melting tanks.

It has also been found that the alternately applied CrTaN layers stabilize the cubic crystal structure of the AlTiN layers, so that a largely stable cubic crystal structure can accordingly be formed as a result of the above-described production of the multilayer coating system.

The process is preferably configured so that CrTaN is deposited with addition of nitrogen from a composite target, preferably from a composite target having a Ta content of 1-60 at.-%, particularly preferably a Ta content of 20-30 at.-%, particularly preferably a Ta content of 25 at.-%.

Preference is also given to an embodiment of the process in which AlTiN is deposited with addition of nitrogen from a composite target, preferably from a composite target having a Ti content of 10-80 at.-%, particularly preferably a Ti content of 25-50 at.-%, particularly preferably a Ti content of 40 at.-%.

The abovementioned deposition of CrTaN and/or AlTiN from a composite target makes it possible to achieve not only formation of a stable cubic crystal structure but also in each case single-phase deposition of the respective CrTaN and/or AlTiN layers, which has an advantageous effect on the operating life.

The use of composite targets also makes it possible to dispense with the more complicated cosputtering using a plurality of targets, so that a more efficient coating process can be achieved.

In the multilayer coating system, AlTiN is preferably applied with an atomic composition of $Al_xTi_{1-x}N$ in which $0.2 \leq x \leq 0.9$, preferably $0.4 \leq x \leq 0.8$, particularly preferably $0.5 \leq x \leq 0.7$, to the substrate. The layer composition is preferably measured by glow discharge optical emission spectroscopy (hereinafter referred to as GDOES) or energy dispersive X-ray spectroscopy (hereinafter referred to as EDX).

In the multilayer coating system, CrTaN is preferably applied with an atomic composition of $Cr_{1-y}Ta_yN$ in which $0.01 \leq y \leq 0.65$, preferably $0.2 \leq y \leq 0.4$, particularly preferably $0.25 \leq y \leq 0.35$, to the substrate, measured by GDOES or EDX.

The abovementioned compositions of CrTaN and AlTiN lead to a particularly hard multilayer coating system forming a stable cubic crystal structure to produce a hard material layer.

For the present purposes, a multilayer coating system is a system in which CrTaN and AlTiN layers are applied alternately by means of PVD to the substrate. Here, the individual layers of the multilayer coating system are preferably deposited in thicknesses in the range from 5 to 200 nanometers, preferably from 10 to 100 nanometers, particularly preferably 15 nanometers.

In the multilayer coating system, preference is given to from 10 to 5000, preferably from 25 to 1000, particularly preferably from 50 to 250, layers being deposited alternately. In this way, it is possible to deposit a stable hard material layer which at the same time allows efficient production of the overall hard material layer.

As a result of the layer thicknesses and numbers of the layers indicated above, an efficient ratio between hardness, stability, wear resistance and operating life of the hard material layer is firstly provided, and, secondly, the requirement for a short process time and thus cost-efficient production of the hard material layer is also met.

As substrate materials, preference is given to using cemented carbides, cermets, hard materials or tool steels, with the substrate preferably being pretreated before application of the respective coating.

In an alternative embodiment of the process, at least one layer AlTiXN instead of AlTiN is deposited alternately with CrTaN in the multilayer coating system, where X=Ta, V, Si, Mo or Hf, with AlTiXN preferably being deposited from a composite target. The additional incorporation of Ta, V, Si, Mo or Hf enables the material properties of the hard material layer to be varied further, with the fundamental advantageous properties, as have been described above, continuing to be retained.

Preference is given to an AlTiN base layer firstly being deposited, preferably in a thickness of from 0.5 to 10 μm, particularly preferably from 1 to 5 μm, very particularly preferably 2 μm, on the substrate by means of physical vapor deposition (PVD) and the multilayer coating system being applied to this AlTiN base layer by means of alternate deposition of CrTaN and AlTiN.

The base layer provides a bonding layer between the substrate and the multilayer coating system and in this way makes even better adhesion of the hard material layer to the substrate possible.

As an alternative, a base layer composed of AlTiXN can be deposited instead of AlTiN, where X=Ta, V, Si, Mo or Hf, with AlTiXN preferably being deposited from a composite target.

Furthermore, a covering layer composed of TiN or CrTaN can be applied on top of the multilayer coating system by means of physical vapor deposition (PVD), preferably in a thickness of from 0.1 to 10 μm, preferably from 0.5 to 5 μm and particularly preferably 1 μm. The application of the covering layer makes it possible to achieve further advantageous adaptation of the properties of the hard material layer, for example in the form of an increase in the Young's modulus.

The multilayer coating system, preferably in combination with the respective covering layer, can preferably be after-treated, for example by wet blasting, dry blasting or coloring, with the surface structure and/or the surface roughness here preferably being matched to the respective intended field of application.

The deposition of the CrTaN layer preferably takes place from a CrTa composite target, preferably from a CrTa composite target having an atomic composition of 75/25. For example, a chemical composition of the deposited CrTaN layer of $Cr_{0.71}Ta_{0.29}N$ can be measured by EDX in this case.

The abovementioned object is also achieved by a hard material layer as claimed in claim 12, wherein a hard material layer is formed on a substrate by means of the above-described process.

Furthermore, the abovementioned object is also achieved by a cutting tool having a substrate composed of cemented carbide as claimed in claim 13. Advantageous embodiments may be derived from the dependent claims.

Accordingly, a cutting tool having a substrate composed of cemented carbide is proposed. According to the invention, a multilayer coating system has been applied to the substrate by alternate deposition of CrTaN and AlTiN by means of physical vapor deposition (PVD).

The advantages described above in respect of the process are obtained here for the formation of this hard material layer on the substrate to form the cutting tool. The high hardness of the hard material layer combined with a relatively low coefficient of friction is particularly advantageous.

An AlTiN base layer is advantageously provided, preferably in a thickness of from 0.5 to 10 μm, particularly preferably from 1 to 5 μm, very particularly preferably 2 μm, between the substrate and the CrTaN/AlTiN multilayer coating system.

It is also advantageous to apply at least one covering layer composed of TiN or CrTaN, preferably in a thickness of from 0.1 to 10 μm, preferably from 0.5 to 5 μm and particularly preferably 1 μm, on top of the CrTaN/AlTiN multilayer coating system.

The substrate of the cutting tool is advantageously pretreated, preferably polished, before application of the respective coating.

To achieve particularly advantageous utility of the cutting tool, the CrTaN/AlTiN multilayer coating system is preferably after-treated and the surface structure and/or the surface roughness are matched to the respective application, particularly preferably by wet blasting, dry blasting and/or coloring.

In the above-described process for producing a hard material layer, a composite target is preferably used for the deposition of CrTaN. It is accordingly a further object of the present invention to provide a process for producing a coating source for carrying out the process for producing the hard material layer, and also a coating source.

This object is achieved by a process for producing a coating source having the features of claim 16. Advantageous embodiments may be derived from the dependent claims.

Accordingly, a process for producing a coating source for the physical vapor deposition (PVD) of CrTaN, wherein, according to the invention, a powder mixture of pure Cr powder and pure Ta powder is provided and the coating source is shaped by hot densification of the powder mixture, is proposed.

In this way, a coating source for the deposition of CrTaN in a PVD plant, by means of which deposition of CrTaN with a predetermined atomic composition can be achieved, with the resulting layer having a stable cubic crystal structure and being made up of a single phase, can be provided in a simple way.

The powder mixture before hot densification is preferably provided with a Ta content of 1-60 at.-%, particularly preferably a Ta content of 20-30 at.-%, very particularly preferably with a Ta content of 25 at.-%. The compositions which are acknowledged to be advantageous in the layers deposited thereby can be achieved in this way.

The particle size of the Cr powder and/or of the Ta powder is preferably below 45 μm in order to achieve particularly homogeneous mixing of the powder mixture and to achieve particularly fine dispersion of the $Cr_2Ta$ phase on hot densification.

The hot densification is preferably carried out by means of hot pressing, spark plasma sintering (SPS) or hot isostatic pressing (HIP) and the powder is preferably treated and/or inductively heated by means of heating conductors and/or directly by means of electric current during pressing.

In order to achieve an advantageous microstructure of the coating source, hot pressing preferably takes place in a temperature range of 1100-1750° C., particularly preferably in a temperature range of 1300-1500° C.

The treatment time is preferably less than one hour in order to avoid recrystallization and retain the fine-grain nature of the microstructure. Furthermore, complete conversion of Ta into the $Cr_2Ta$ phase also does not take place in the case of short sintering times, so that three phases, namely a pure Ta phase, a pure Cr phase and the $Cr_2Ta$ phase, are present in the resulting microstructure of the coating source.

BRIEF DESCRIPTION OF THE SEVERAL VIEWS OF THE DRAWING

Preferred further embodiments and aspects of the present invention are illustrated by the following description of the figures.

The figures show.

DETAILED DESCRIPTION OF PREFERRED WORKING EXAMPLES

Figure 1:
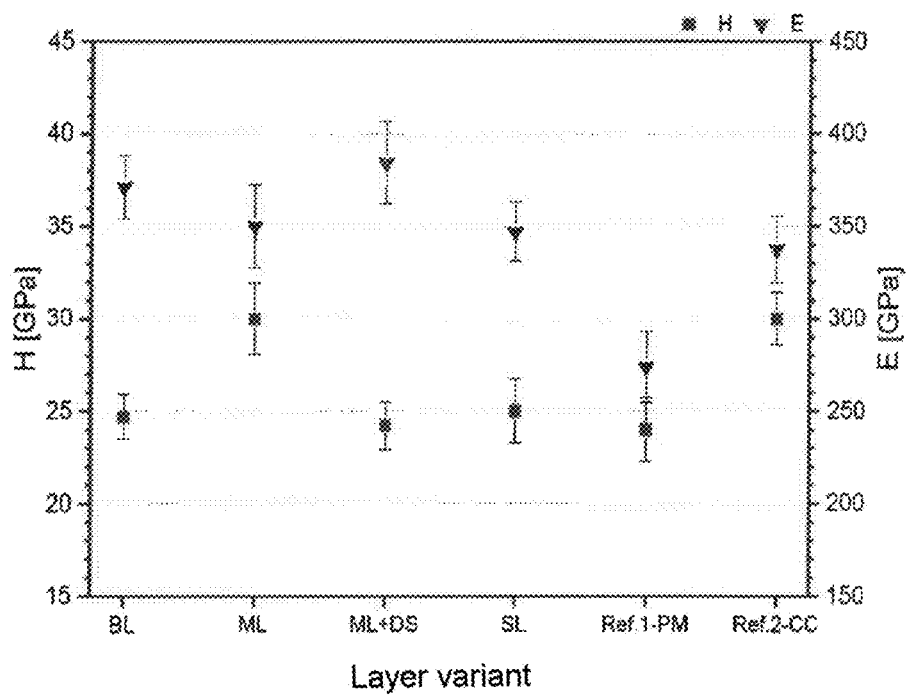
FIG. 1 a presentation of the measured values for the nanohardness H and the elastic modulus E of different CrTaN layer systems, FIG. 2 an SEM (scanning electron microscopy) image of the fracture surface of a layer system on a substrate having an AlTiN base layer and an AlTiN/CrTaN multilayer coating system, FIG. 3 a presentation of the measured values of a cutting machine test, FIG. 4 a metallographic polished section with grain boundary etching of a coating source in the form of a CrTa composite target and FIG. 5 a phase diagram of the microstructure of the CrTa composite target.

Preferred working examples are described below with the aid of the figures. Here, identical elements, similar elements or elements having the same effect are denoted by identical reference symbols and repeated description of these elements will sometimes be dispensed with in order to avoid redundancies in the description.

To produce a hard material layer by means of physical vapor deposition (PVD), a multilayer coating system is applied to a substrate by alternate deposition of CrTaN and AlTiN. The hard material layer serves, for example, as wear protection layer for cutting or machining tools.

As substrate for PVD coating as mentioned above, it is possible to employ virtually all available cemented carbide substrates and cermet substrates, and all refractory metals can also be used, with the layer systems described herein also being conceivable, for example, as oxidation protection for elements in glass melting tanks. The substrates can be pretreated and in particular polished, ground or blasted in order to assist the subsequent formation of the hard material layer and the dimensional trueness of the finished coated component.

Particular preference is given to carrying out the buildup of the layers by means of composite targets, i.e. targets which have a composition made up of a plurality of different phases. For example, powder-metallurgically produced composite targets can be employed here. A possible production route for CrTa composite targets is described in detail below with reference to FIGS. 4 and 5.

The coatings are, for example, applied to a cemented carbide substrate at temperatures of 400-600° C. by means of PVD processes. The coating process can be carried out, for example, in an ARC-PVD coating plant, in a sputtering plant or in an HIPIMS plant.

Layer systems in which CrTaN layers and AlTiN layers have been applied to the substrate are presented by way of example below, with different layer sequences having been applied and a plurality of relevant parameters then having been measured in each case.

Illustrative layer sequences of the specimens having AlTiN and CrTaN layers are shown in table 1:

TABLE 1

Illustrative combinations of substrate, layer and after-treatment

| Substrate | Layer | After-treatment |
|---|---|---|
| Unrestricted | AlTiN/CrTaN<br>AlTiN/(AlTiN/CrTaN multilayer coating system)<br>(AlTiN/CrTaN multilayer coating system)<br>AlTiN/(AlTiN/CrTaN multilayer coating system)/CrTaN | Dry or wet blasting |

To be able to deposit the layers, the following compositions of the targets indicated in table 2 below, for example, were provided in the PVD plant. When single-layer coatings were provided, they were deposited separately for determination of the chemical composition and the composition was determined by means of GDOES. For better comparability with the target composition, the nitrogen is not shown in the following table. Accordingly, in the case of the target compositions indicated in the first double column, the layer composition indicated in the second column sequence, which was correspondingly determined by means of GDOES, is obtained. Instead of or in addition to the GDOES measurement, an EDX measurement can also be carried out.

TABLE 2

Illustrative target composition and layer composition (in each case atomic)

| Target | | Individual layers of the coating (GDOES) | |
|---|---|---|---|
| Ti | 100 | Ti | |
| AlTi | 60/40 | AlTi | 63/37 |
| CrTa | 75/25 | CrTa | 71/29 |

It has been found to be advantageous in the deposition of the layers to deposit CrTaN with addition of nitrogen from a composite target, preferably from a composite target having a Ta content of 1-60 at.-%, particularly preferably a Ta content of 20-30 at.-%, particularly preferably a Ta content of 25 at.-%.

Particularly advantageous composition ranges for the $Cr_{1-y}Ta_yN$ layer are thus $0.01 \leq y \leq 0.65$, preferably $0.2 \leq y \leq 0.4$, particularly preferably $0.25 \leq y \leq 0.35$.

The CrTaN layer can be deposited from a CrTa composite target, which has the advantage over the cosputtering of a plurality of metallic targets that a single-phase cubic structure is deposited, as can be confirmed, for example, by XRD. Correspondingly, an improved structure of the hard material layer, which is achieved by stabilization of the cubic crystal structure, is obtained as a result of the use of composite targets.

For deposition of the AlTiN layer, it has been found to be advantageous to deposit AlTiN in a nitrogen atmosphere from a composite target, preferably from a composite target having a Ti content of 10-80 at.-%, particularly preferably a Ti content of 25-50 at.-%, particularly preferably a Ti content of 40 at.-%.

A composition range of the $Al_xTi_{1-x}N$ layer is thus advantageously $0.2 \leq x \leq 0.9$, preferably $0.4 \leq x \leq 0.8$, particularly preferably $0.5 \leq x \leq 0.7$.

Here too, an at least largely single-phase cubic structure is obtained by deposition from the composite target, which can be confirmed, for example, by XRD.

To build up the multilayer coating system, the individual layers of the multilayer coating system are preferably deposited in thicknesses in the range from 5 to 200 nanometers, preferably from 10 to 100 nanometers, particularly preferably 15 nanometers. In the samples having the illustrative structure here, the thickness of the individual layers was about 15 nanometers.

Furthermore, preference is given to depositing from 10 to 5000, preferably from 25 to 1000, particularly preferably from 50 to 250, alternating layers to build up the multilayer coating system. In the specimens built up here, about 100 alternating layers were deposited for the multilayer coating system.

In view of this background, the following layer systems were built up by way of example and then measured:

BL: AlTiN/CrTaN double layer, with AlTiN being deposited in a thickness of 2 μm on the substrate and CrTaN having been deposited in a thickness of 2.9 μm on top of this.

ML: AlTiN base layer with CrTaN/AlTiN multilayer coating system built up thereon, with the AlTiN base layer having been applied in a thickness of 1.8 μm and the CrTaN/AlTiN multilayer coating system having been applied in a thickness of 3 μm. The individual layers of the multilayer coating system had a thickness of about 15 nm.

ML+DS: AlTiN base layer on top of which an AlTiN/CrTaN multilayer coating system had been built up and a CrTaN covering layer having been deposited thereon, with the CrTaN covering layer having a thickness of 1.1 μm, the AlTiN/CrTaN multilayer coating system having a thickness of 2 μm and the base layer AlTiN having a thickness of 1.9 μm.

The individual layers of the multilayer coating system had a thickness of about 15 nm.

SL: CrTaN as single layer having a layer thickness of 2.5 μm of CrTaN.

Ref.1-PM: Reference layer composed of AlTiN as single layer, deposited from a 60/40 Al/Ti composite target in a thickness of 2.8 μm.

Ref.2-CC: Reference layer composed of AlTiN as single layer, deposited from a 60/40 AlTiN plug target in a thickness of 3 μm.

Table 3 below shows a layer sequence of a system made up of an AlTiN base layer with a CrTaN single layer applied thereon, with a multilayer coating system accordingly not being selected here. This structure corresponds to the specimen designated as BL above.

TABLE 3

Illustrative layer sequence, layer thickness and chemical composition of the layer, starting from the substrate

| No. | Layer type | Layer thickness [μm] intended | min | max | Chemical composition | Measurement method |
|---|---|---|---|---|---|---|
| 2 | CrTaN | 3.0 | 0.5 | 7.0 | $(Cr_{0.71}Ta_{0.29})N$ | EDX |
| 1 | AlTiN | 2.0 | 0.5 | 7.0 | $(Al_{0.63}Ti_{0.37})N$ | EDX |
| Total thickness | | 5 | 10 | 14 | | |

In table 4 below, a multilayer coating system was applied to an AlTiN base layer, with the individual layer thickness being about 15 nm in the multilayer coating system. This structure corresponds to the abovementioned specimen ML.

TABLE 4

Illustrative layer sequence, layer thickness and chemical composition of the layer, starting from the substrate

| No. | Layer type | Layer thickness [μm] intended | min | max | Chemical composition | Measurement method |
|---|---|---|---|---|---|---|
| 2 | CrTaN/AlTiN | 3.0 | 0.5 | 7.0 | | |
| 1 | AlTiN | 2.0 | 0.5 | 7.0 | $(Al_{0.63}Ti_{0.37})N$ | EDX |
| Total thickness | | 5 | 10 | 14 | | |

Finally, a hard material layer having a CrTaN covering layer, a CrTaN/AlTiN multilayer coating system and an AlTiN base layer was built up on the cemented carbide substrate, giving the structure shown in table 5 below. This structure corresponds to the abovementioned specimen ML+DS.

TABLE 5

Illustrative layer sequence, layer thickness and chemical composition of the layer, starting from the substrate

| No. | Layer type | Layer thickness [μm] intended | min | max | Chemical composition | Measurement method |
|---|---|---|---|---|---|---|
| 3 | CrTaN | 1.0 | 0.1 | 4.0 | $(Cr_{0.71}Ta_{0.29})N$ | EDX |
| 2 | CrTaN/AlTiN | 2.0 | 0.5 | 5.0 | | |
| 1 | AlTiN | 2.0 | 0.5 | 7.0 | $(Al_{0.63}Ti_{0.37})N$ | EDX |
| Total thickness | | 5 | 11 | 16 | | |

FIG. 1 shows values of the nanohardness H and the elastic modulus E for different layer systems having at least one CrTaN layer.

The nanohardness was measured here by means of a nanoindenter (Ultra-Micro-Indentation System—UMIS) having a Berkovich diamond indentation body. 16 indentations per specimen were carried out for each of the measurements and the nanohardness and the Young's modulus were determined.

It can be seen immediately from FIG. 1 that, compared to the single layer SL and the double layer BL, which each comprised a CrTaN layer, a significant increase in hardness was obtained by the use of the multilayer coating system ML. Starting out from the SL and BL specimens, which had a nanohardness of from 16.0 to 15.5 GPa, the nanohardness increased to from about 25 to 30 GPa in the case of the ML specimens.

It can be seen from the results shown in FIG. 1 that the multilayer coating system ML has a greater hardness and thus also improved wear properties compared to the single layers SL and double layers BL.

Compared to the AlTiN layers, in particular Ref. 1-PM and Ref. 2-CC layers, too, a higher nanohardness can be achieved, as can likewise be seen from FIG. 1.

A multilayer coating system made up of CrTaN and AlTiN thus gives a hardness increase compared to the single layers or a double layer composed of these materials.

Furthermore, it is found that the thermal decomposition of CrTaN into $Cr_2N$ and $Ta_2N$, as would occur, for example, in the case of single-layer coatings and as is described in the literature, is largely suppressed in the multilayer coating system.

Accordingly, the proposed multilayer coating system gives a coating system which is particularly suitable for high-temperature use. In the case of the multilayer coating system, it is found that the thermal decomposition is prevented by the stabilization of the cubic crystal structure, so that the applied layer is also thermally stable, as a result of which longer operating lives are possible. This property profile is accordingly suitable for use as wear protection layer on cemented carbide indexable cutting plates and also in solid cemented carbide tools.

Furthermore, a lower coefficient of friction of the multilayer coating system ML was found in the tribometer test (at room temperature, 500° C. and 700° C.).

A ball-on-disc tribometer from CSM Instruments in the configuration with a counterbody composed of $Al_2O_3$ having a diameter of 6 mm was used for this purpose and measurements were carried out at room temperature (RT), 500° C. and 700° C. The load set was 5N, the slide distance was 300 m and the speed was 10 cm/s. The radius of the wear groove was 5 mm. Measurement of the wear groove was carried out by means of a Veeco white light profilometer and a 2D cross section and a 3D depiction were produced.

The measurements on the abovementioned specimens are shown in table 6 below. It can immediately be seen that the achievable coefficients of friction (p) for the multilayer coating system ML are ≤0.7, at best even ≤0.6. The specimen having the multilayer coating system ML is accordingly particularly suitable for use in tools for which the coefficients of friction have to be low, for example in thread-cutting tools, reamers and solid metal tools.

TABLE 6

Measured coefficients of friction and wear coefficients

| Designation | Layer thickness [μm] | Coefficient of friction μ [—] | | | Wear coefficient K [m³/(Nm)] | | |
|---|---|---|---|---|---|---|---|
| | | RT | 500° C. | 700° C. | RT | 500° C. | 700° C. |
| BL | 2/2.0 | 0.71 | 0.66 | 0.60 | $1.27*10^{-15}$ | $1.55*10^{-14}$ | $1.65*10^{-14}$ |
| ML | 1.8/3 | 0.67 | 0.57 | 0.56 | $1.67*10^{-15}$ | $6.67*10^{-15}$ | $1.25*10^{-14}$ |
| ML + DS | 1.9/2/1.1 | 0.60 | 0.58 | 0.58 | $1.14*10^{-15}$ | $9.70*10^{-15}$ | $1.45*10^{-14}$ |
| SL | 2.4 | 0.61 | 0.59 | 0.51 | $1.81*10^{-15}$ | $9.32*10^{-15}$ | $8.19*10^{-15}$ |
| Ref. 1-PM | 2.8 | 0.85 | 0.96 | 0.86 | $2.28*10^{-14}$ | $5.37*10^{-16}$ | $4.60*10^{-15}$ |
| Ref. 2-CC | 3 | 0.88 | 1.02 | 0.88 | $1.87*10^{-14}$ | $5.79*10^{-16}$ | $4.45*10^{-15}$ |

Furthermore, the residual stress states of the layer systems are listed in table 7 below. The stresses were determined in the "as deposited" state by the wafer curvature method on silicon specimens. However, depending on the method by which the layers are produced, these values can vary.

TABLE 7

Residual stresses in the layers measured by the wafer curvature method on Si specimens

| Designation | Layer | Stresses [MPa] |
|---|---|---|
| BL | TiAlN/TaCrN | ~−370 |
| ML | TiAlN/TiAlN TaCrN | ~−450 |
| ML + DS | TiAlN/TiAlN TaCrN/TaCrN | ~−450 |
| SL | TaCrN | ~−500 |
| Ref. 1-PM | TiAlN PM targets | ~−550 |
| Ref. 2-CC | TiAlN plug targets | ~−1200 |

It can be seen that the multilayer coating system ML also has relatively low intrinsic stresses in the coating, as a result of which the life and period of operation are additionally positively influenced.

Figure 2:
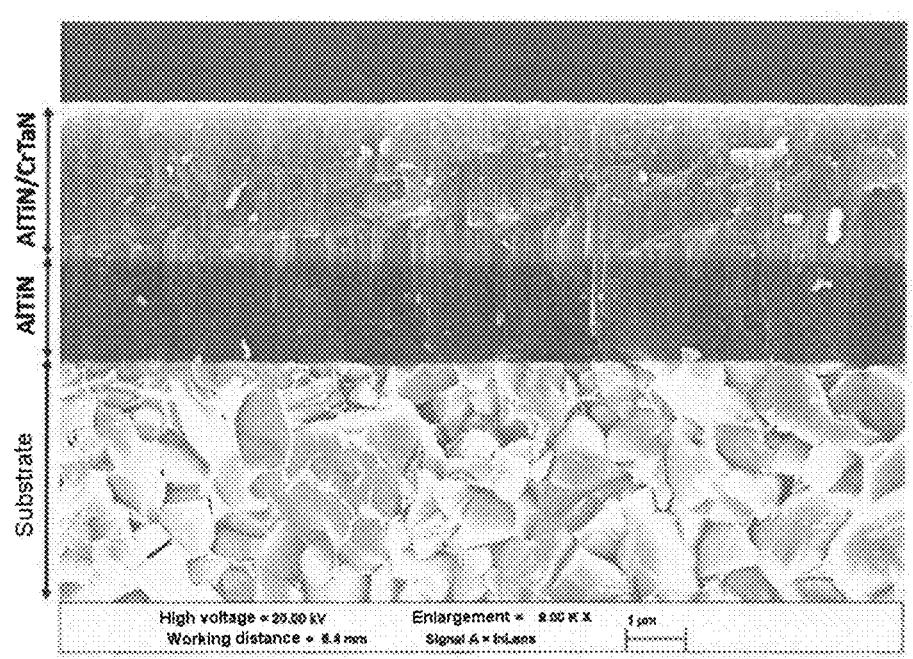

An illustrative structure of a multilayer coating system ML is shown as an image of a fracture surface in FIG. 2, in which an AlTiN base layer was provided on a cemented carbide substrate and the AlTiN/CrTaN multilayer coating system was then applied on top of this.

Accordingly, a tremendous increase in hardness combined with low coefficients of friction and a long operation life are obtained in the case of the above-described multilayer coating system ML.

When a multilayer coating system ML was used, it was confirmed in cutting machining tests that a coating is particularly advantageous for thread-cutting tools, reamers and solid cemented carbide tools, namely everywhere where the coefficient of friction should be low and a high hardness is required at the same time.

Figure 3:
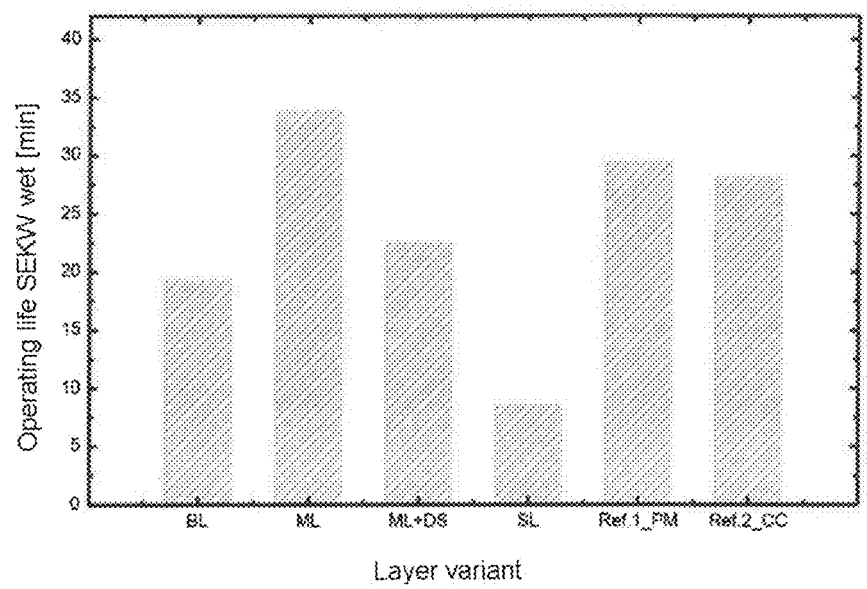

The measurement results of cutting machining tests for the different multilayer coating systems are shown in FIG. 3. Here, the operating life of a cutting insert of a milling cutter in wet milling in minutes is reported. In detail, the cutting machining test was carried out using the following test parameters:

Climb milling with a single tooth, with a spiral cut in the plane of the block being made. SP300 high-speed steel was used as material and the tool was an ISCAR F45ST D050-22 for accommodating indexable cutting plates, which was installed in an SK50 tool seat. The workpiece in each case had dimensions of 400×200×96 mm and a strength of 1000 N/mm². The milling cutter had a diameter of 50 mm and was advanced at a pitch of 45° with a cutting speed $v_c$ of 250 m/min (dry) and 150 m/min (wet), a tooth advance $f_{z\ of}$ 0.25 mm and an engagement width $a_e$ of 32 mm.

It can immediately be seen from FIG. 3 that the multilayer coating system ML has the best operating life. In the case of wet machining, an about 20% better operating life compared to the reference layer systems is obtained. In the case of the dry machining which is not shown in the figure, the multilayer coating system ML is, however, not significantly better than in the case of the reference layer systems.

Furthermore, a cutting tool for cutting machining apparatus, which has a suitable substrate, preferably a cemented carbide substrate, having the prescribed geometry, can also be produced. The cutting tool can, for example, be in the form of a cutting body for lathes and milling machines or in the form of an indexable cutting plate.

A hard material layer having a multilayer coating system made up of CrTaN alternating with AlTiN in low layer thicknesses is then applied to this substrate using the process indicated above.

Furthermore, in order to match the surface structure and/or the surface roughness to the respective application, the hard material layer can be subjected to an after-treatment. This after-treatment can, for example, be carried out by wet blasting, dry blasting and/or coloring. Any covering layer and/or functional layer applied can also be subjected to such an after-treatment.

The production of coating sources in the form of CrTa composite targets, as were advantageously used in the above-described processes for producing hard material layers for the deposition of the CrTaN layers by PVD, will be discussed in detail below.

To produce the composite targets, pure Cr and pure Ta powder are firstly provided as raw materials. The particle size of the powders is preferably below 45 μm in each case. The two powders are mixed very homogeneously with one another in the desired ratio of the CrTa composite targets to be produced from the powder. Due to the fine particle size, the mixture of the two powders can be made particularly homogeneous and a $TaCr_2$ phase finely dispersed in the target can be formed in the subsequent densification process.

As stated above, a Ta content of 1-60 at. %, particularly preferably 20-30 at. %, very particularly preferably 25 at. %, is preferably produced in the mixture for the CrTa composite target to be produced.

The CrTa composite target is then produced in a pressing mold from the essentially homogeneous powder mixture by means of a sintering operation. The sintering operation is, for example, carried out by hot pressing, spark plasma sintering (SPS) or hot isostatic pressing (HIP). In each case, the powder can be treated in a chamber by means of heating conductors or directly with an electric current and/or inductively heated during pressing.

The sintering by means of SPS or hot pressing in order to produce the CrTa composite targets takes place in the temperature range of 1100-1750° C., preferably in the temperature range of 1300-1500° C. The sintering time is kept quite short, preferably less than one hour, in order to avoid recrystallization and obtain the fine-grained nature of the microstructure.

Figure 4:
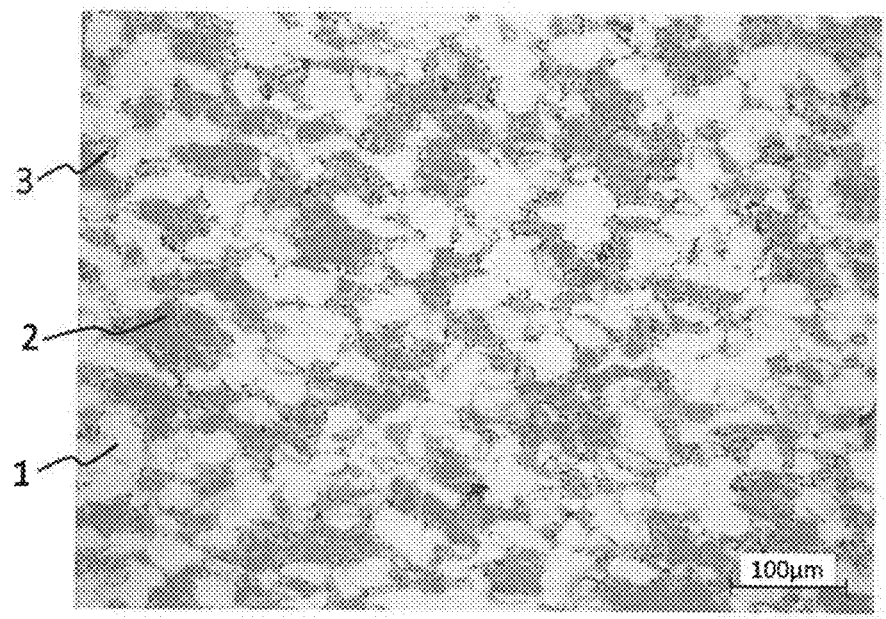
Figure 5:
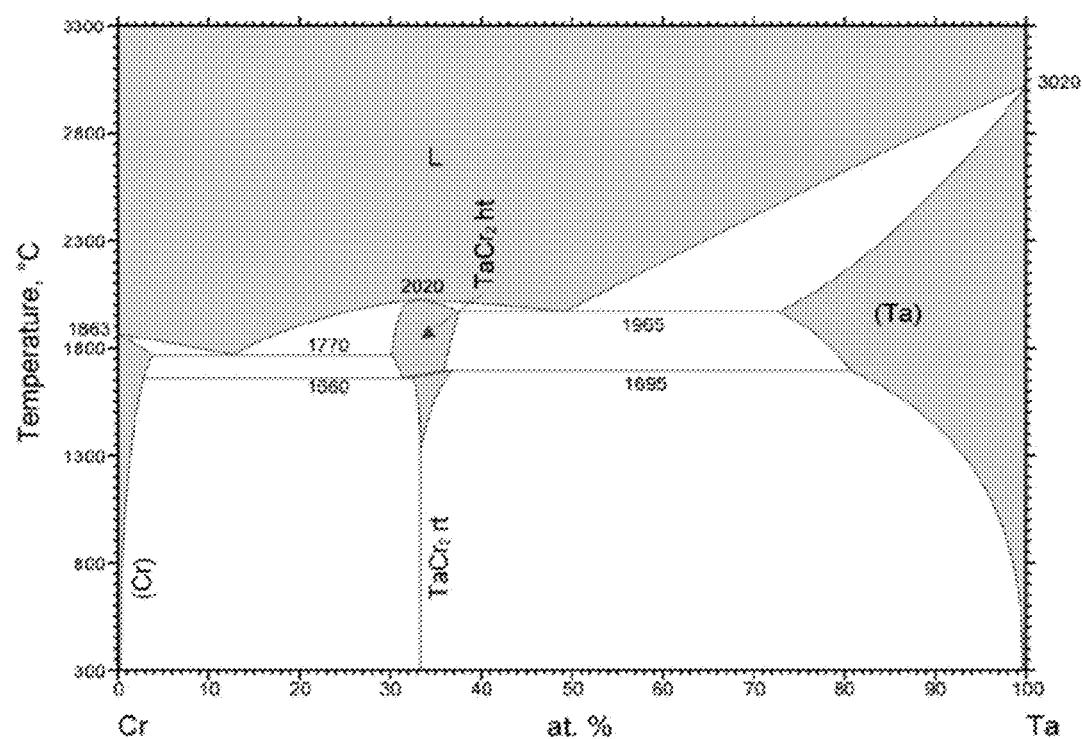

A metallographic polished section with grain boundary etching through the composite target produced in this way is shown in FIG. 4. After the sintering process, the microstructure consists of three phases, namely a pure Cr or Cr mixed crystal phase 1, a pure Ta or Ta mixed crystal phase 2 and a $TaCr_2$ phase 3. The $TaCr_2$ phase 3 is present at the grain boundaries at the transitions from Ta to Cr. In order to provide the CrTa composite target in the proposed manner, all three phases mentioned have to be present. The corresponding phase diagram is shown in FIG. 5.

The measured density after sintering is at least 90% of the theoretical density, preferably 95% or 98%.

The CrTa composite targets produced in this way can either be used directly, or can, in order to improve handling, be fastened on their rear side to a backing plate, e.g. by bonding, hard soldering or diffusion bonding, by means of which the targets can then be fastened in the PVD plant for deposition of CrTaN. It is also possible for a plurality of CrTa composite targets to be fastened to a single backing plate, for example in order to take account of the desired geometry in the PVD plant.

If applicable, all individual features which are presented in the individual working examples can be combined with one another and/or exchanged without going outside the scope of the invention.

The invention claimed is:

1. A process for producing a hard material layer on a substrate, the method comprising:
    providing the substrate; and
    applying a multilayer coating system to the substrate by alternate deposition of CrTaN and AlTiN in a physical vapor deposition (PVD) process.

2. The process according to claim 1, which comprises depositing CrTaN from a composite target.

3. The process according to claim 2, wherein the composite target has a Ta content of 1-60 at.-%.

4. The process according to claim 1, which comprises depositing AlTiN from a composite target.

5. The process according to claim 4, wherein the composite target has a Ti content 10-80 at.-%.

6. The process according to claim 1, which comprises applying AlTiN with an atomic composition of $Al_xTi_{1-x}N$ to the substrate, wherein $0.2 \leq x \leq 0.9$, measured by GDOES or EDX.

7. The process according to claim 1, which comprises applying CrTaN with an atomic composition of $Cr_{1-y}Ta_yN$ to the substrate, wherein $0.01 \leq y \leq 0.65$, measured by GDOES or EDX.

8. The process according to claim 1, which comprises depositing individual layers of the multilayer coating system in thicknesses in a range from 5 to 200 nanometers.

9. The process according to claim 1, which comprises alternately depositing from 10 to 5000 layers in the multilayer coating system.

10. The process according to claim 1, which comprises applying at least one layer AlTiXN, where X is selected from the group consisting of Ta, V, Si, Mo and Hf, instead of AlTiN alternately with CrTaN in the multilayer coating system.

11. The process according to claim 1, which comprises first depositing an AlTiN base layer on the substrate by physical vapor deposition (PVD) and applying the multilayer coating system to the AlTiN base layer by alternately depositing CrTaN and AlTiN layers.

12. The process according to claim 11, which comprises depositing a base layer composed of AlTiXN, where X is selected from the group consisting of Ta, V, Si, Mo and Hf, instead of AlTiN.

13. The process according to claim 1, which comprises applying a covering layer composed of TiN or CrTaN on top of the multilayer coating system by physical vapor deposition (PVD).

14. A cutting tool, comprising a substrate composed of cemented carbide and a multilayer coating on said substrate formed by physical vapor deposition (PVD) with alternate deposition of CrTaN and AlTiN layers.

15. The cutting tool according to claim 14, comprising an AlTiN base layer between said substrate and said multilayer coating of CrTaN/AlTiN.

16. The cutting tool according to claim 14, which comprises at least one covering layer composed of TiN or CrTaN formed on top of said multilayer coating of CrTaN/AlTiN.

17. A process for producing a coating source for physical vapor deposition (PVD) of CrTaN on a substrate, the process comprising providing a powder mixture of pure Cr powder and pure Ta powder, and shaping the coating source by hot densification of the powder mixture.

18. The process according to claim 17, which comprises providing the powder mixture with a Ta content of 1-60 at.-%.

19. The process according to claim 17, wherein said Cr powder and/or said Ta powder has a particle size of less than 45 μm.

20. The process according to claim 17, wherein the hot densification is a process selected from the group consisting of hot pressing, pressing with direct passage of current and hot isostatic pressing (HIP).

21. The process according to claim 20, wherein the hot densification is a spark plasma sintering (SPS) process.

22. The process according to claim 17, wherein the hot densification is a hot pressing process in a temperature range of 1100-1750° C.

* * * * *